US006957373B2

(12) United States Patent
Ernst et al.

(10) Patent No.: US 6,957,373 B2
(45) Date of Patent: Oct. 18, 2005

(54) ADDRESS GENERATOR FOR GENERATING ADDRESSES FOR TESTING A CIRCUIT

(75) Inventors: Wolfgang Ernst, München (DE); Justus Kuhn, München (DE); Jens Luepke, München (DE); Peter Poechmüller, Colchester, VT (US); Gunnar Krause, München (DE); Jochen Mueller, München (DE); Michael Schittenhelm, Poing (DE)

(73) Assignee: Infineon Technologies AG, München (DE)

( * ) Notice: Subject to any disclaimer, the term of this patent is extended or adjusted under 35 U.S.C. 154(b) by 466 days.

(21) Appl. No.: 10/092,129

(22) Filed: Mar. 6, 2002

(65) Prior Publication Data

US 2002/0170012 A1 Nov. 14, 2002

(30) Foreign Application Priority Data

Mar. 9, 2001 (DE) ................................ 101 11 440

(51) Int. Cl.⁷ ................... G01R 31/28; G06F 11/00; G06F 12/00; G06F 12/02; G06F 12/04
(52) U.S. Cl. ..................... 714/743; 711/200
(58) Field of Search .............. 714/702, 718, 714/722, 730, 738, 739, 743; 711/219, 200

(56) References Cited

U.S. PATENT DOCUMENTS

| | | | | |
|---|---|---|---|---|
| 4,779,084 A | * | 10/1988 | Tanaka et al. | 345/574 |
| 5,657,466 A | * | 8/1997 | Yazawa | 711/220 |
| 5,883,905 A | * | 3/1999 | Eastburn | 714/738 |
| 6,038,692 A | * | 3/2000 | Shim | 714/765 |

FOREIGN PATENT DOCUMENTS

DE    4446988 A1    7/1995

* cited by examiner

Primary Examiner—Albert Decady
Assistant Examiner—John J. Tabone, Jr.
(74) Attorney, Agent, or Firm—Jenkins, Wilson & Taylor, P.A.

(57) ABSTRACT

An address generator is provided for generating addresses for testing an addressable circuit. The address generator can include a base address register for buffer-storing a base address. The base address register can be assigned an associated offset register group having a plurality of offset registers for buffer-storing relative address values. Further, the address generator can include a first multiplexer circuit which is dependent on a base register selection control signal, switches through an address buffer-stored in the base address register to a first input of an addition circuit and to an address bus, which is connected to the circuit to be tested. A second multiplexer circuit can be dependent on the base register selection control signal, through-connects the offset register group associated with the through-connected base address register to a third multiplexer circuit, which is dependent on an offset register selection control signal.

10 Claims, 4 Drawing Sheets

ADDRESS GENERATOR FOR GENERATING ADDRESSES FOR TESTING A CIRCUIT

The invention relates to an address generator for generating addresses for testing an addressable circuit, and in particular for testing an addressable memory module.

U.S. Pat. No. 6,038,692 describes a memory system for error correction with an address generator. The address generator comprises a base address counter and a plurality of offset address generators, the base address counter being connected to an input of an addition circuit. The address generator furthermore contains a multiplexer circuit which, in a manner dependent on a selection control signal, through-connects an offset address generator to a further input of the addition circuit. The addition circuit adds the address present at the first input to the relative address value present at the second input.

DE 4 446 988 A1 describes a test pattern generator. The test pattern generator serves for generating addresses for testing an addressable circuit. In the test pattern generator, a plurality of arithmetic units are used for generating the addresses. The test pattern generator can be operated with a minimal number of control lines by a test device.

After the production operation, circuits are generally subjected to a test operation in order to test whether they are functional. Integrated semiconductor circuits, in particular, comprise a multiplicity of components in order to test their functionality in complicated test methods.

FIG. 1 shows a test arrangement according to the prior art. A test device is connected via a data bus having the bus width D and an address bus having the bus width A to a circuit to be tested DUT (DUT: Device under test) and checks the functionality thereof. The circuit to be tested is, for example, a memory having a multiplicity of memory cells which are arranged in matrix form and can be addressed via the address bus. The test device generates, in an address generator, the addresses of the memory cells to be tested. In a test pattern generator, test data patterns are generated and applied via the data bus to the memory cells to be tested. Afterward, the data are read out again from the memory cells via the data bus and compared with the expected data in a test evaluation circuit within the test device. The circuit to be tested may be any desired digital circuit for example a memory, a logic circuit or a circuit which contains both logic elements and memory cells. If the data acquired by the test data evaluation circuit correspond to the expected data values, the test device recognizes that the circuit to be tested DUT is functional.

FIG. 2 diagrammatically shows the construction of a memory having M×N memory cells SZ which are arranged in matrix form and can be addressed via row addresses X and column addresses Y. Integrated memories, for example DRAM memories, are complex circuit arrangements in which memory cells lying next to one another in the logical address space are remote front one another in the real circuitry arrangement, for example in a different layer of the semiconductor memory. Conversely, memory cells whose logical addresses have a large difference often adjoin one another. In order to test interactions between different memory cells, the test program carries out defined jumps from one memory cell $SZ_A$ to another memory cell $SZ_B$. The functionality of the individual memory cells SZ is tested by writing in data and subsequently reading out data. In order to test interactions between the memory cells SZ, predetermined address patterns are applied to the memory.

The disadvantage of the conventional test arrangement illustrated in FIG. 1 is that the address bus width A is relatively large, i.e. that many address bus lines have to be led from the test device to the circuit to be tested DUT. If the circuit to be tested DUT is an M×N memory, for example, the number A of address lines is:

$$A = 1dM + 1dN$$

where M is the number of column address lines and N is the number of row address lines of the memory to be tested DUT.

Synchronous DRAM memories already operate at operating frequencies of a few 100 MHz and must be tested by the test device with a corresponding clock frequency. The test arrangement according to the prior art as illustrated in FIG. 1 has the disadvantage that the number of address lines or the address bus width A is relatively high and the length of the test lines leading from the test device to the circuit arrangement to be tested DUT is large. In order to enable testing of a circuit arrangement operated at high frequency, such as, for example, a DRAM memory, it is necessary, therefore, to use highly complex test devices in the test arrangement illustrated in FIG. 1, the test frequency of which test devices corresponds to the operating frequency of the circuit arrangement to be tested and which test devices have an address bus width A which is identical to the address bus width of the circuit to be tested (DUT).

The object of the present invention, therefore, is to provide an address generator for generating addresses for testing an addressable circuit which can be operated with a minimal number of control lines by a test device.

This object is achieved according to the invention by means of an address generator having the features specified in patent claim 1.

The invention provides an address generator for generating addresses for testing an addressable circuit, having: at least one base address register for buffer-storing a base address, which base address register is in each case assigned to an associated offset register group having a plurality of offset registers for buffer-storing relative address values; a first multiplexer circuit, which, in a manner dependent on a base register selection control signal, switches through an address buffer-stored in the base address register to a first input of an addition circuit and to an address bus, which is connected top the circuit to be tested; a second multiplexer circuit, which, in a manner dependent on the base register selection control signal, through-connects the offset register group associated with the through-connected base address register to a third multiplexer circuit, which, in a manner dependent on an offset register selection control signal, through-connects an offset register of the through-connected offset register group to a second input of the addition circuit; the addition circuit adding the base address present at the first input to the relative address value present at the second input to form an address which is written to the base address register.

In a preferred embodiment of the address generator according to the invention, the base address register and the associated offset registers can be initialized by an external test device, via initialization lines.

In a further preferred embodiment of the address generator according to the invention, the address signal switched through to the address bus can be inverted by a controllable inverting circuit.

In a further preferred embodiment of the address generator according to the invention, the number of offset registers of an offset register group is equal to the number of address test jump variants required for testing the circuit.

In a further preferred embodiment of the address generator according to the invention, the circuit to be tested is a synchronous memory which is operated with a high operating clock frequency.

The memory preferably has a multiplicity of memory cells which can be addressed via a multidimensional address space.

In this case, the number of base address registers preferably corresponds to the dimension of the address space of the memory to be tested.

In a particularly preferred embodiment of the address generator according to the invention, the base address register selection control signals and the offset register selection control signals are applied to the address generator by an external test device via an address control signal bus, the bus width of the address control signal bus between the test device and the address generator being less than the bus width of the address bus between the address generator and the circuit to be tested.

The length of the address bus lines between the address generator and the circuit to be tested is preferably much smaller than the length of the address control lines between the test device and the address generator.

In a particularly preferred embodiment, the address generator is integrated in the circuit to be tested.

Preferred embodiments of the address generator according to the invention are described below with reference to the accompanying figures for elucidating features that are essential to the invention.

Figure 1:
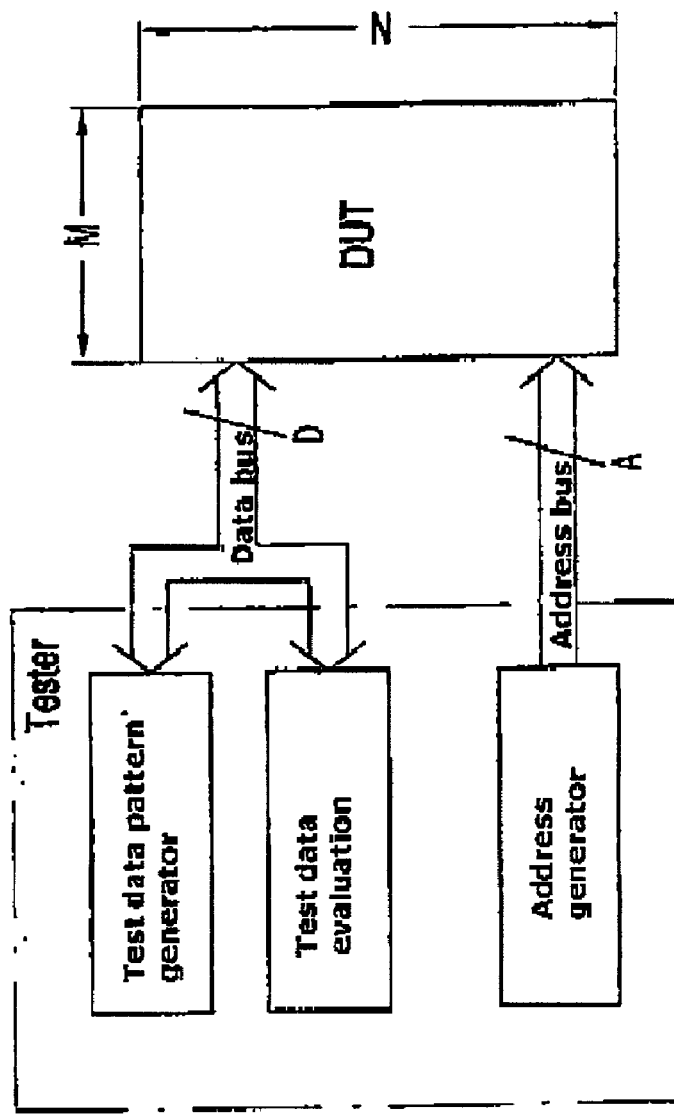
FIG. 1 shows a test arrangement according to the prior art.
Figure 2:
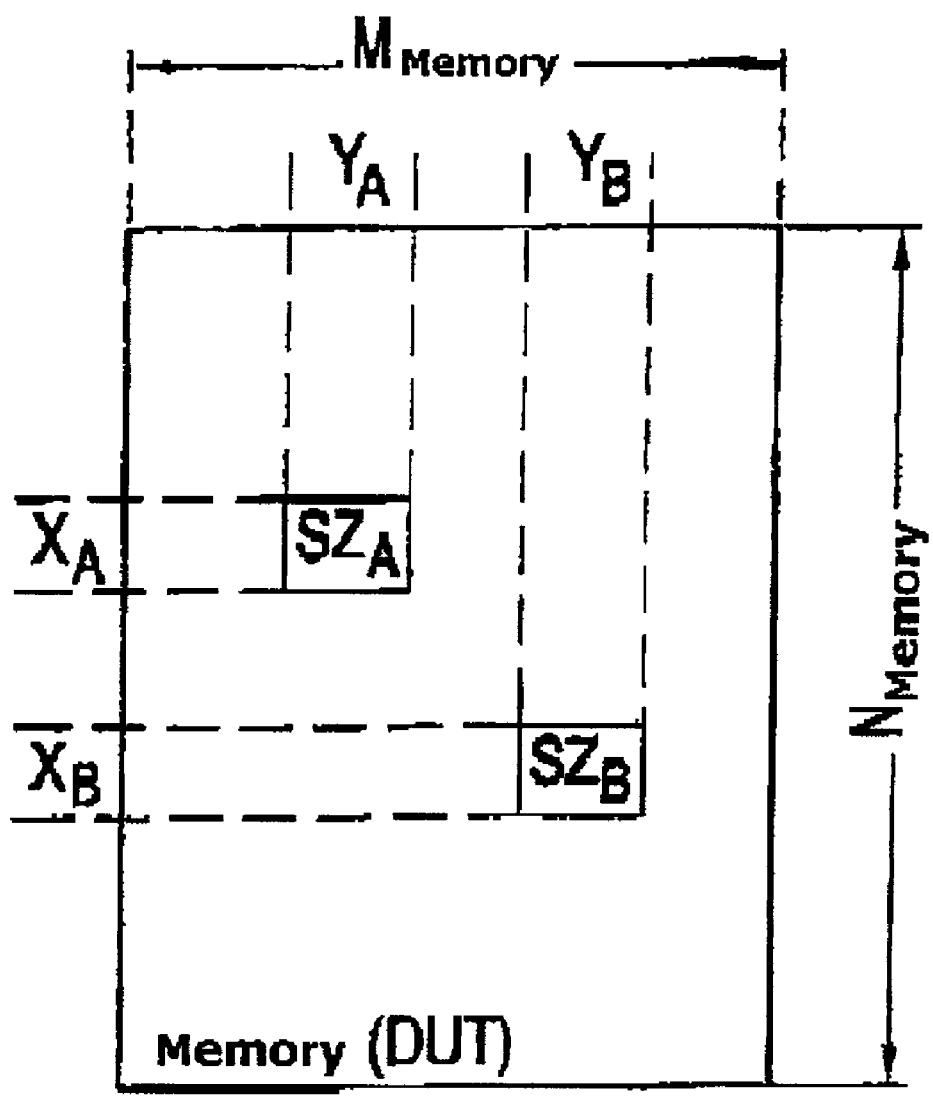
FIG. 2 shows a memory to be tested, having a plurality of memory cells.
Figure 3:
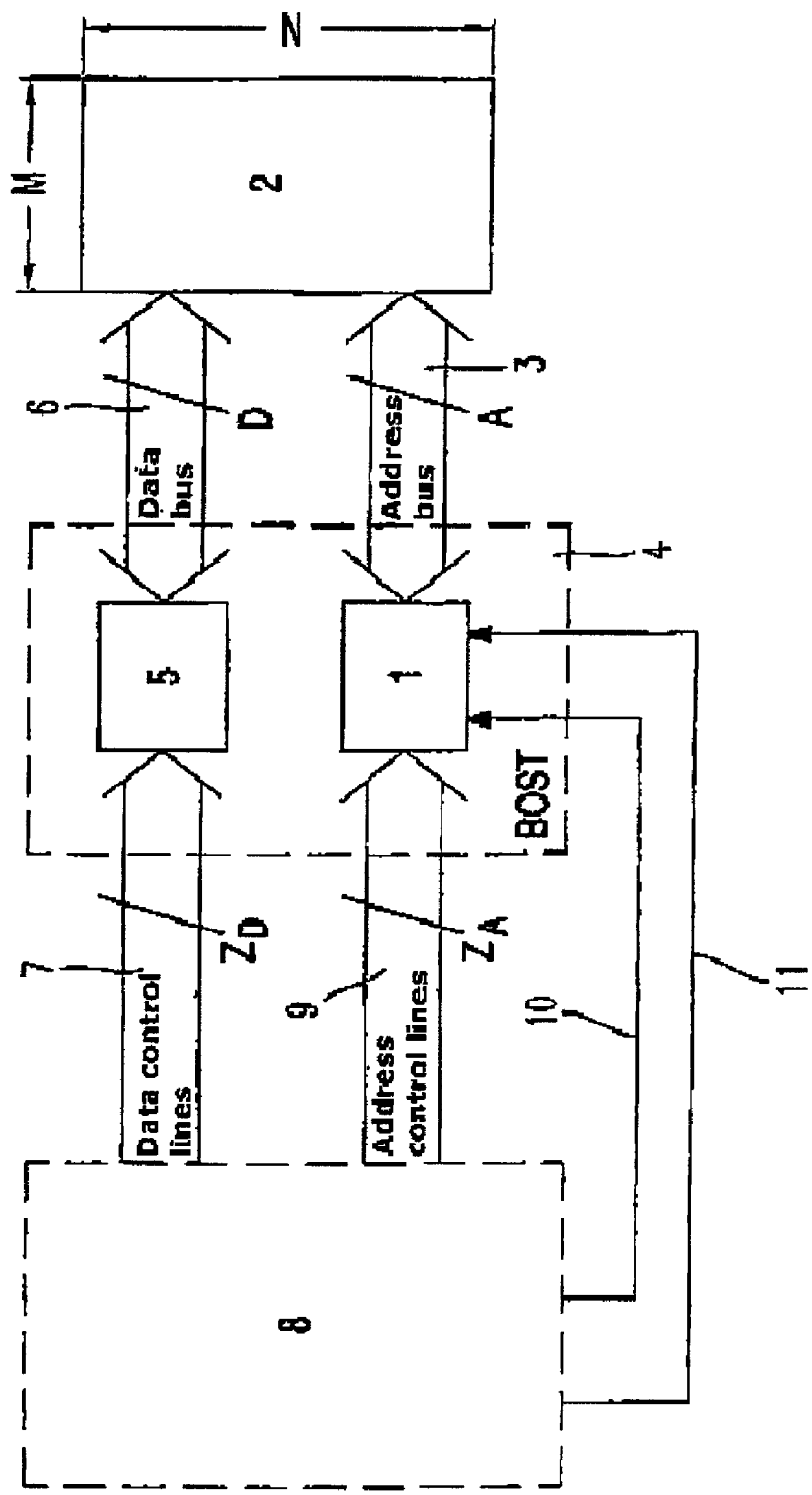
FIG. 3 shows a test arrangement in which the address generator according to the invention is used.

FIG. 3 illustrates a test arrangement in which the address generator 1 according to the invention is used. The address generator 1 serves for generating addresses for testing an addressable circuit 2 to be tested. The address generator 1 and the circuit 2 to be tested are connected to one another via an address bus 3. The address generator 1 applies via the address bus 3 successive addresses of memory cells or addressable components to be tested within the circuit 2. In the test arrangement illustrated in FIG. 3, the address generator 1 is situated in a test circuit 4 designed, for example, as an application-specific integrated circuit (ASIC). In addition to the address generator 1, the test circuit 4 contains a circuit 5 for generating test data patterns and evaluating them. The circuit 5 is likewise connected to the circuit 2 to be tested, via a data bus 6 having the data bus width D. The data pattern generator 5 generates test data patterns which are written to the addressed memory cells via the data bus 6 and are subsequently read cut again via the data bus 6. The data read out are compared with the expected data through test data of the evaluation circuit 5. The test data pattern generator and evaluation circuit 5 is driven by an external conventional test device 8 via a data control line bus 7 having the bus width $Z_D$. The test device 8 drives the address generator 1 according to the invention within the test circuit 4 via an address control line bus 9. Furthermore, the test device 8 is connected to the address generator 1 via initialization lines 10 and via an inversion control line 11.

In a first embodiment, in an application-specific integrated circuit ASIC, the test circuit 4 is provided as an autonomous semiconductor circuit between the actual rest device 8 and the circuit arrangement 2 to be tested. In an alternative embodiment, the test arrangement 4 is integrated into the circuit arrangement 2 to be tested. In both embodiments, the length off the address bus lines of the address bus 3 between the address generator 1 and the circuit arrangement 2 to be tested is significantly smaller than the length of the address control lines between the test device 8 and the address generator 1. As a result of this, the address test signals present on the address bus 3 are significantly more robust relative to high-frequency interference signals which originate e.g. from other address lines. Furthermore, the address test signals are degraded to a much lesser extent by the address lines, so that the signal edges of the address signals which arrive at the circuit 2 to be tested are relatively steep, thereby avoiding errors during the testing of the circuit arrangement 2.

Figure 4:
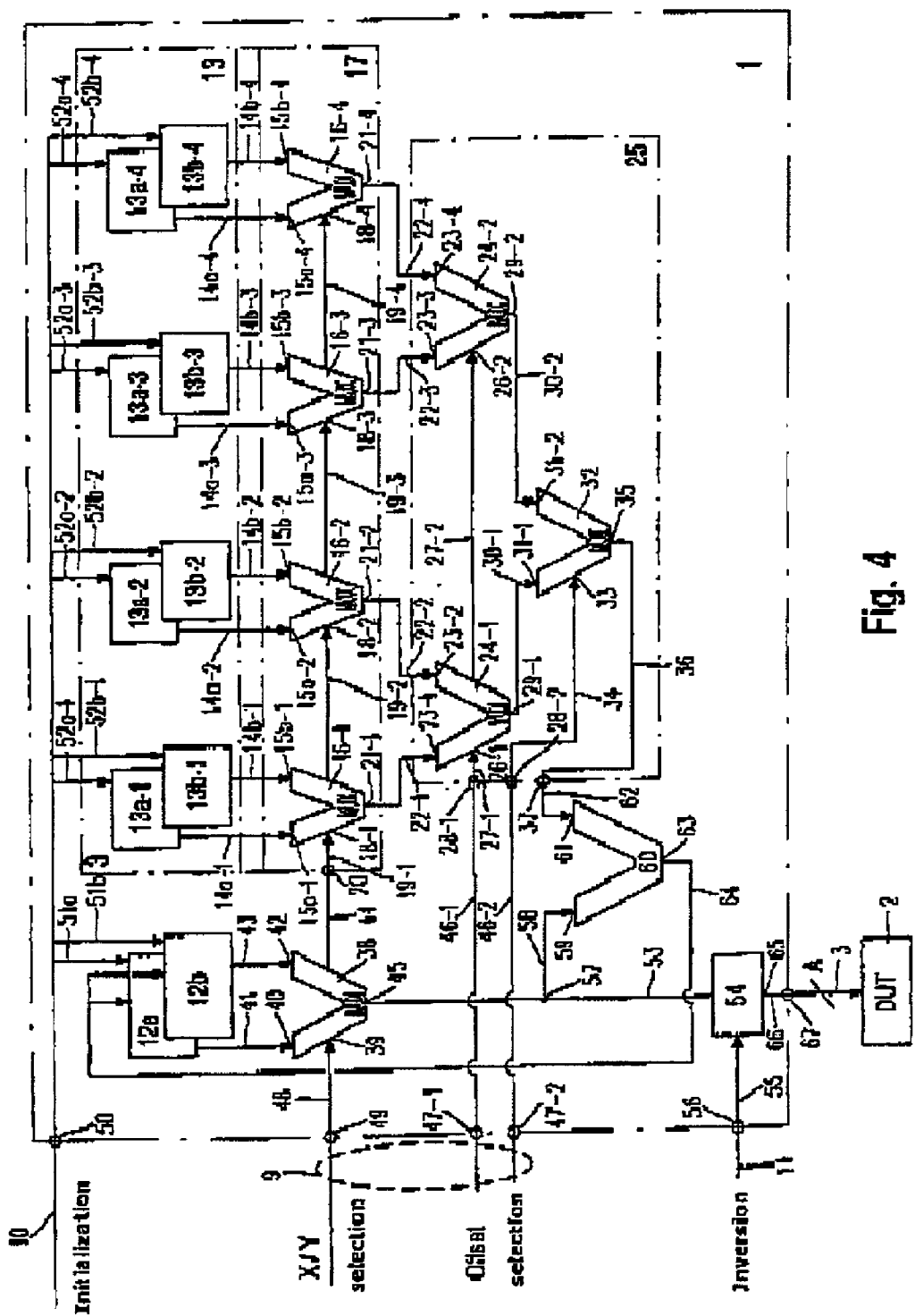
FIG. 4 shows a particularly preferred embodiment of the address generator according to the invention.

FIG. 4 shows a particularly preferred embodiment of the address generator 1 according to the invention. The address generator 1 contains a plurality of base address registers 12a, 12b, . . . The base address registers 12 serve for buffer-storing a base address which can be initialized by the external test device 8 via the initialization lines 10. Each of the base address registers 12 is assigned an offset register group 13. With the embodiment illustrated in FIG. 4, the offset register group 13a, which has a plurality of offset registers 13a-1, 13a-2, 13a-3, 13a-4 for buffer-storing relative address values, is assigned to the base address register 12a for the X address or row address of the memory 2 to be tested. A second offset register group 13b, which comprises a plurality of offset registers 13b-1, 13b-2, 13b-3, 13b-4, is assigned to the second base address register 12b for buffer-storing the Y address or column address of the memory 2. The relative address values of the different offset registers of an offset register group 13a, 13b can likewise be set or programmed by the test device 8 via initialization lines 10.

The number of offset registers within an offset register group 13a, 13b is four in the exemplary embodiment illustrated in FIG. 4 and corresponds to the number of required jump variants for testing the circuit arrangement 2. A wide variety of test jump variants can be programmed into the address generator 1 according to the invention by the test device a via the initialization lines 10. If, in one test jump variant, for example, the same memory cell is to be tested again, the relative address values which are written to the corresponding offset registers 13a-i, 13b-i of the offset register groups 13a, 13b are zero in each case. If, in a further test jump variant, the memory cell of the next column within the memory 2 is to be tested, the relative address value is zero in the offset register 13a-i and one in the offset register 13b-i. If, in a further test jump variant, for example, the memory cell of the next but one column and next row is to be tested, the relative address value of the offset register 13a-i is one and the relative address value of the offset register 13b-i is two.

In the exemplary embodiment illustrated in FIG. 4, it is possible to program four different test jump variants. In further embodiments (not illustrated) of the address generator 1 according to the invention, correspondingly more offset registers are provided for increasing the possible test jump variants.

The offset registers of the offset register groups 13a, 13b are connected via lines 14a, 14b to inputs 15a, 15b of multiplexers 16 within a first controllable multiplexer circuit 17. The multiplexers 16-1 to 16-4 within the first multiplexer circuit 17 each have control inputs 18, which are connected via lines 19 to a control input 20 of the first multiplexer circuit 17. Furthermore, the multiplexers 16-1 to 16-4 within the first multiplexer circuit 17 have outputs 21, which are connected via lines 22 to inputs 23 of multiplexers 24 within a multiplexer circuit 25. The multiplexers 24-1 to 24-2 within the multiplexer circuit 25 have control inputs 26, which are connected via control lines 27 to a control input 28 of the multiplexer circuit 25. Furthermore, the multiplexers 24-1, 24-2 have outputs 29, which are connected via lines 30 to inputs 31 of a further multiplexer 32 connected downstream in a cascade-type manner within the multiplexer circuit 25. The multiplexer 32 connected downstream has a control input 33, which is connected via a control line 34 to a further control input 29-2 of the multiplexers 25. The multiplexer 32 has an output 35, which is connected via a line 36 to an output 37 of the multiplexer circuit 25.

In addition to the multiplexer circuit 17 and the multiplexer circuit 25, the address generator 1 according to the invention, as is illustrated in FIG. 4, contains a further multiplexer circuit 38, which, in manner dependent on the base register selection control signal present on the control line 9 switches through an address buffer-stored in the base address registers 12-1, 12-2 from a first input of an addition circuit to an address bus of the circuit 2 to be tested. For this purpose, the multiplexer circuit 38 has a control input 39, which is connected to the control line 9. The multiplexer circuit 30 has a first input 40, which is connected via a line 41 to the first base address register 12a for buffer-storing the row address X, and a second input 42, which is connected via a line 43 to the second bate address register 12b for buffer-storing the column address Y. The control inputs 39 of the multiplexer circuit 38 and the control input 20 of the multiplexer circuit 17 receive the same base register selection control signal via the control line 9. For this purpose, the control input 20 of the multiplexer circuit 17 is likewise connected to the control line 9 to form a control line 44. If, in a manner dependent on the base register selection control signal applied on the control line 9, a base address register 12-i is through-connected by the first multiplexer circuit 38 to the output 45 thereof, all the offset registers of the offset register group 13 associated with the through-connected base register 12 are simultaneously through-connected by the multiplexer circuit 17 to the multiplexer circuit 25.

The control inputs 28-1, 28-2 of the multiplexer circuit 25 are connected to a control terminal 47 of the address generator 1 via lines 46. The control input 20 of the multiplexer circuit 17 is connected via a line 44 and the control input 39 of the multiplexer circuit 38 is connected via a line 48 to a further control terminal 49 of the address generator 1 according to the invention. The control inputs 47, 49 are driven by the external test device 8 via address control lines of the address control line bus 9.

Furthermore, the test device 8 is connected via initialization lines 10 to an initialization terminal 50 of the address generator 1. The initialization terminal 50 is connected to the base address registers 12a, 12b via internal initialization lines 51 and to the offset registers 13 via internal initialization lines 52.

In the embodiment illustrated in FIG. 4, the output 55 of the multiplexer circuit 38 is connected via lines 53 to an inverting circuit 54. The inverting circuit 54 is e.g. an XOR logic circuit connected via internal lines 55 to a control terminal 56 of the address generator 1 according to the invention. The control terminal 56 receives an inversion control signal from the external test device 8 through lines 11. The inversion circuit 54 makes it possible, as required, to invert address signals for testing the circuit arrangement 2 bit by bit.

At the branching node 57 the address switched-through by the multiplexer circuit 45 is applied via lines 58 to a first input 59 of an addition circuit 60. The addition circuit 60 has a second input 61, which is connected via lines 62 to the output 37 of the multiplexer circuit 25. The addition circuit 60 adds the switched-through base address present at the first input 59 to the relative address value which is present at the second input 61 and is switched through by the multiplexer circuit 25 in a manner dependent on the offset register selection control signal, to form a summation address value which is written via an output 63 and lines 64 to the base address register 12 for generating the next address. The controllable inversion circuit 54 has an output 65, which is connected via internal lines 66 to an output 67 of the address generator 1 according to the invention.

In order to test the circuit arrangement 2, firstly the base addresses are initialized by the test device 8 via the initialization lines 10 and written to the base address registers 12. Furthermore, the relative jump values of the different test jump variants to be tested are initialized by the writing of relative address values to the offset registers 13. A base address is selected by the application of a base register selection control signal to the control terminal 49 via address control lines 9. Afterward, the desired test jump variant or the desired relative address value is selected by the application of an offset register selection control signal to the control input 47 of the address generator 1. The addressed memory cell is subsequently tested by applying and reading out data. The operation is repeated until it is identified that the test operation has ended.

In the exemplary embodiment illustrated in FIG. 4, the number $Z_A$ of required control lines 9 of the address control signal bus 9 for controlling the address jumps is three.

Generally the number $Z_A$ of required control lines for the driving of the address generator 1 by the external test device 8 is:

$$Z_A = 1dd + 1dp$$

where d is the dimension of the address space of the circuit arrangement 2 to be tested, and p is the number of desired test jump variants.

In the example illustrated in FIG. 4, a memory Z arranged in a matrix-type manner with a two-dimensional address space d=2 is tested, the number of possible test jump variants p being four in the example illustrated. The number of required control lines for the driving of the address generator is thus three.

In a memory 2 having 1024 (=$2^{10}$) column addresses and 1024 (=$2^{10}$) row addresses, the address bus width A of the address bus between the address generator 1 and the memory is at least ten, while the number $Z_A$ of required control lines for the driving of the address generator 1 by the external test device 8 comprises merely three lines. Consequently, the number $Z_A$ of required address control lines for the driving of the address generator 1 by the test device 8 is significantly less than the width of the address bus 3. If the test arrangement 4 comprising the address generator 1 is positioned, as application-specific integrated circuit (ASIC), in spatial proximity to the circuit arrangement 2 or if the test arrangement 4 is even integrated into the circuit arrangement 2, the length of the address control lines of the address control line bus 9 is significantly greater than the length of the address lines between the address generator 1 according to the invention and the circuit arrangement 2 to be tested. The control signals on the address control lines which are output from the test device 8 to the address generator 1 according to the invention have a significantly lower clock frequency than the clock frequency with which the generated addresses are applied from the address generator 1 to the circuit arrangement 2 for testing.

In the test arrangement according to the invention as illustrated in FIG. 3, it is therefore possible to use an external test device 8 with a relatively low operating frequency, the test device 8, moreover, only having to have a very small number of address control lines. In the test arrangement according to the invention as illustrated in FIG. 3, it is therefore possible to use conventional test devices 8 which operate with a relatively low operating frequency, for testing memory modules 2 which operate with a considerably higher clock frequency of a few 100 MHz, without necessitating a considerable additional outlay on circuitry.

List of Reference Symbols
1. Address generator
2. Circuit to be tested
3. Address bus
4. Test circuit
5. Test pattern generator and evaluation circuit
6. Data bus
7. Data control line bus
8. Test device
9. Address control line bus
10. Initialization lines
11. Inversion control line
12. Base address register
13. Offset register
14. Line
15. Multiplexer input
16. Multiplexer
17. Multiplexer circuit
18. Control inputs
19. Control line
20. Control input
21. Output
22. Lines
23. Multiplexer input
24. Multiplexer
25. Multiplexer circuit
26. Control input
27. Control line
28. Control input
29. Output
30. Line
31. Input
32. Multiplexer
33. Control input
34. Control line
35. Output
36. Line
37. Output
38. Multiplexer circuit
39. Control input
40. Input
41. Line
42. Input
43. Line
44. Control line
45. Output
46. Control lines
47. Control input
48. Control line
49. Control input
50. Initialization terminal
51. Initialization lines
52. Initialization lines
53. Line
54. Inversion circuit
55. Control line
56. Control input
57. Branching node
58. Line
59. Input
60. Addition circuit
61. Input
62. Line
63. Output
64. Lines
65. Output
66. Line
67. Address output

What is claimed is:

1. An address generator for generating addresses for testing an addressable circuit, having:
   (a) at least one base address register for buffer-storing a base address, the base address register in each case being assigned an associated offset register group having a plurality of offset registers for buffer-storing relative address values;
   (b) a first multiplexer circuit, which, in a manner is dependent on a base register selection control signal, switches through an address buffer-stored in the base address register to a first input of an addition circuit and to an address bus, which is connected to the circuit to be tested, wherein the base address register is switched through by the first multiplexer circuit;
   (c) a second multiplexer circuit, which, in a manner is dependent on the base register selection control signal, through-connects the offset register group associated with the through-connected base address register to a third multiplexer circuit, which, in a manner is dependent on an offset register selection control signal, through-connects an offset register of the through-connected offset register group to a second input of the addition circuit; and
   (d) the addition circuit adding the address present at the first input to the relative address value present at the second input to form an address which is buffer-stored in the base address register.

2. The address generator as claimed in claim 1, wherein the base address register and the associated offset registers can be initialized by an external test device, via initialization lines.

3. The address generator as claimed in claim 1, wherein the address signal switched through to the address bus can be inverted by a controllable inverting circuit.

4. The address generator as claimed in claim 1, wherein the number of offset registers of an offset register group is equal to the number of address test jump variants required for testing the circuit.

5. The address generator as claimed in claim 1, wherein the circuit to be tested is a synchronous RAM memory with a high operating clock frequency.

6. The address generator as claimed in claim 1, wherein the RAM memory has a multiplicity of memory cells which can be addressed via a multidimensional address space (X, Y).

7. The address generator as claimed in claim 1, wherein the number of base address registers corresponds to the dimension (d) of the address space of the memory to be tested.

8. The address generator as claimed in claim 1, wherein the base register selection control signals and the offset register selection control signals are applied to the address generator by an external test device via an address control signal bus, the bus width of the address control signal bus being less than the bus width of the address bus of the circuit to be tested.

9. The address generator as claimed in claim 1, wherein the line lengths of the address bus lines between the address generator and the circuit to be tested are smaller than the line lengths of the address control lines between the test device and the address generator.

10. The address generator as claimed in claim 1, wherein the address generator is integrated in the circuit to be tested.

\* \* \* \* \*